United States Patent
Sugahara

[11] Patent Number: 6,078,506
[45] Date of Patent: Jun. 20, 2000

[54] TAPE-BALL GRID ARRAY TYPE SEMICONDUCTOR DEVICE HAVING REINFORCEMENT PLATE WITH SLITS

[75] Inventor: Kenji Sugahara, Tokyo, Japan

[73] Assignee: NEC Corporation, Tokyo, Japan

[21] Appl. No.: 09/022,428

[22] Filed: Feb. 12, 1998

[30] Foreign Application Priority Data

Feb. 13, 1997 [JP] Japan ................................ 9-029031

[51] Int. Cl.[7] .................................................. H05K 7/02
[52] U.S. Cl. ...................... 361/783; 361/764; 361/774; 257/704; 257/738; 257/778; 438/121
[58] Field of Search .................................. 174/16.3, 254, 174/252; 228/180.21, 180.22; 257/690, 692, 696, 697, 699, 704, 707, 710, 711, 712, 713, 718, 719, 723, 724, 728, 734, 735, 737, 738, 772, 773, 778, 779, 780; 361/688, 690, 692, 704, 707, 710–712, 714, 717, 718, 719, 720, 723, 760, 761, 764, 772, 774, 783; 438/122, 123, 121

[56] References Cited

U.S. PATENT DOCUMENTS

| 5,586,010 | 12/1996 | Murtuza et al. | 361/751 |
|---|---|---|---|
| 5,652,184 | 7/1997 | Goto et al. | 438/122 |
| 5,835,355 | 11/1998 | Dordi | 361/760 |
| 5,914,531 | 6/1999 | Tsunoda et al. | 361/711 |

FOREIGN PATENT DOCUMENTS

| 5102251 | 4/1993 | Japan . |
|---|---|---|
| 7-273246 | 10/1995 | Japan . |
| 8-111433 | 4/1996 | Japan . |
| 888245 | 4/1996 | Japan . |
| 8148526 | 6/1996 | Japan . |
| 9-326450 | 12/1997 | Japan . |

*Primary Examiner*—Leo P. Picard
*Assistant Examiner*—John B. Vigushin

[57] ABSTRACT

An Tape-BGA type semiconductor device can absorb and/or distribute stress created due to difference of thermal expansion between a reinforcement plate of a TAB tape and a mounting substrate to stabilize mounting on a substrate. The Tape-BGA type semiconductor device includes leads formed on an insulative resin film, and electrically connected to electrodes of a semiconductor chip at tip ends thereof, a reinforcement plate formed with an opening portion receiving the semiconductor chip and fixed on the surface of the insulative resin film, a plurality of ball-shaped bumps are arranged on externally connecting portions of the leads in a grid-array fashion, and the reinforcement plate being provided with slits along the opening portion for distributing stress.

6 Claims, 5 Drawing Sheets

TAPE-BALL GRID ARRAY TYPE SEMICONDUCTOR DEVICE HAVING REINFORCEMENT PLATE WITH SLITS

BACKGROUND OF THE INVENTION

1. Field of the Invention

The present invention relates to a semiconductor device having a package of a tape-ball grid array structure.

2. Description of the Related Art

Associating with increasing of package density of semiconductor chips, pitches of electrodes to be formed on the semiconductor chips are progressively reduced. As a result, it becomes difficult to adapt the conventional connection technology using metallic fine wire. As a package mounting the semiconductor chip to be increased the package density, various packaging technologies employing a TAB (Tape Automatic Bonding) tape have been developed and practiced. As one example, there is a TAB in QFP (Quad Flat Package) type semiconductor device which is fabricated into the conventional mold QFP form package employing the TAB tape in place of the conventional wire bonding system using the metallic fine wire. In this kind of package, contact between the TAB tape and a mold filler resin is increased by providing a slit in a heat-resistant film formed of a material, such as polyimide or the like, as the base material of the TAB tape.

In such QFP type semiconductor device employing the TAB tape, narrowing of pitch of the electrodes on the semiconductor chip can be achieved by such technology. However, in order to establish connection between such QFP type semiconductor device and an external device, external leads formed on the periphery of the QFP type semiconductor device have to be used similarly to the prior art. There is a limitation for increasing of pins required in increasing of the package density of the semiconductor chip.

As a form of the semiconductor device which can satisfy demands for narrowing of pitches of the electrodes on the semiconductor chip and increasing of pins of the semiconductor device, there has been developed a BGA (Ball Grid Array) type semiconductor device employing the TAN tape. FIG. 4 is a section of the conventional tape-ball grid array (hereinafter referred to as "Tape-BGA") type semiconductor device and FIG. 5 is a plan view of a reinforcement panel in FIG. 4.

In the Tape-BGA type semiconductor device, electrodes of a semiconductor chip 23 sealed by a sealing resin 24 are connected to leads (not show) formed on a TAB tape 22. In conjunction therewith, on the leads, solder balls 26 for external connection, are arranged in a grid-array form. As a result, a contact area for external connection can be increased without increasing occupied area in comparison with the semiconductor device connected only in the periphery as in the conventional QFP type semiconductor device. Therefore, it is advantageous to be adapted for increasing of number of pins.

However, only by the TAB tape 22, mechanical strength of the solder ball 26 forming portion for external connection becomes too small. Therefore, in the Tape-BGA type semiconductor device, the mechanical strength is improved by fixing a metallic reinforcement plate (support ring) 21 having an opening portion 21a accommodating the semiconductor chip 23 on the TAB tape 22. By the reinforcement plate 21, the strength of the sole Tape-BGA type semiconductor device can be remarkably increased. Thus, it becomes possible to avoid deformation of the semiconductor device in the fabrication process. However, upon mounting of such Tape-BGA type semiconductor device on a substrate, the following problems can be encountered.

Namely, causes to encounter the problems in mounting the Tape-BGA type semiconductor device are difference of thermal expansion coefficient of the Tape-BGA reinforcement plate and a mounting substrate, a difference of a temperature distribution of the Tape-BGA type semiconductor device and the mounting substrate upon mounting. By these causes, problem of deformation is caused in the Tape-BGA type semiconductor device. On the other hand, stress concentration can be caused in the mating portion of the Tape-BGA type semiconductor device and the mounting substrate due to difference of contraction coefficient of the Tape-BGA type semiconductor device and the mounting substrate.

On the other hand, there has been a prior art, in which radially extending slits are provided in a semiconductor chip mounting portion (island portion) of a mold package for reducing stress caused in the semiconductor chip. While radially extending slits may somewhat contribute for absorbing stress to be exerted on the semiconductor chip, they may not be effective in absorbing or eliminating stress to be exerted on the semiconductor chip upon mounting on a substrate.

SUMMARY OF THE INVENTION

Therefore, it is an object of the present invention to solve the foregoing problems upon mounting of a Tape-BGA type semiconductor device without modifying a structure and fabrication process of the Tape-BGA type semiconductor device and to stabilize mounting.

In order to accomplish the above-mentioned object, a tape-ball grid array type semiconductor device comprises:

leads formed on an insulative resin film, and electrically connected to electrodes of a semiconductor chip at tip ends thereof;

a reinforcement plate formed with an opening portion receiving said semiconductor chip and fixed on the surface of said insulative resin film;

a plurality of ball-shaped bumps are arranged on externally connecting portion of said lead in a grid-array fashion; and said reinforcement plate being provided with slits along said opening portion for distributing stress.

In the preferred construction, the opening portion receiving said semiconductor chip may be a quadrangular shape, and said stress distributing slits are provided in parallel to side edges of said opening portion. End edges of adjacent stress distributing slits may be mutually parallel. The stress distributing slits may be formed in greater than or equal to two rows along said opening portion receiving said semiconductor chip.

Preferably, the insulative resin film is a polyimide film, and the reinforcement plate is formed of a metal.

In the Tape-BGA type semiconductor device according to the present invention, since the slits are formed in the reinforcement plate along the opening portion receiving the semiconductor chip, the stress caused due to difference of thermal expansion between the semiconductor device and the mounting substrate can be distributed.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
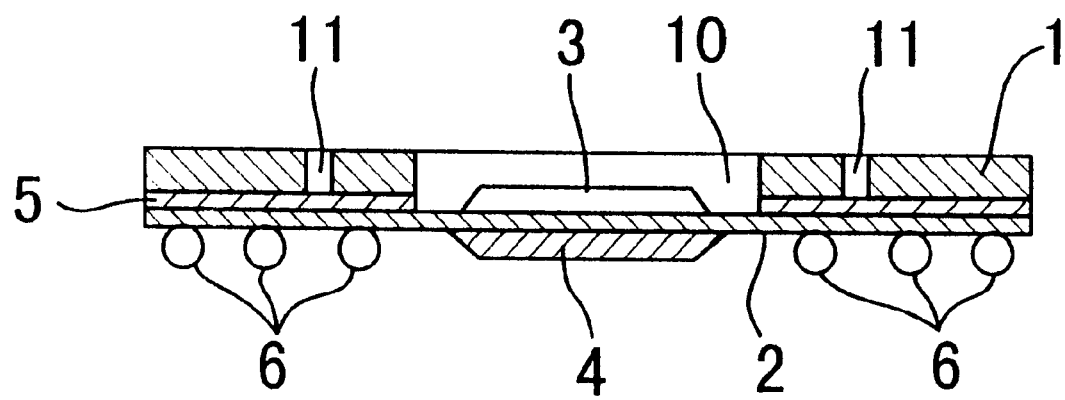
FIG. 1 is a section of the first embodiment of a Tape-BGA type semiconductor device according to the present invention.
Figure 2:
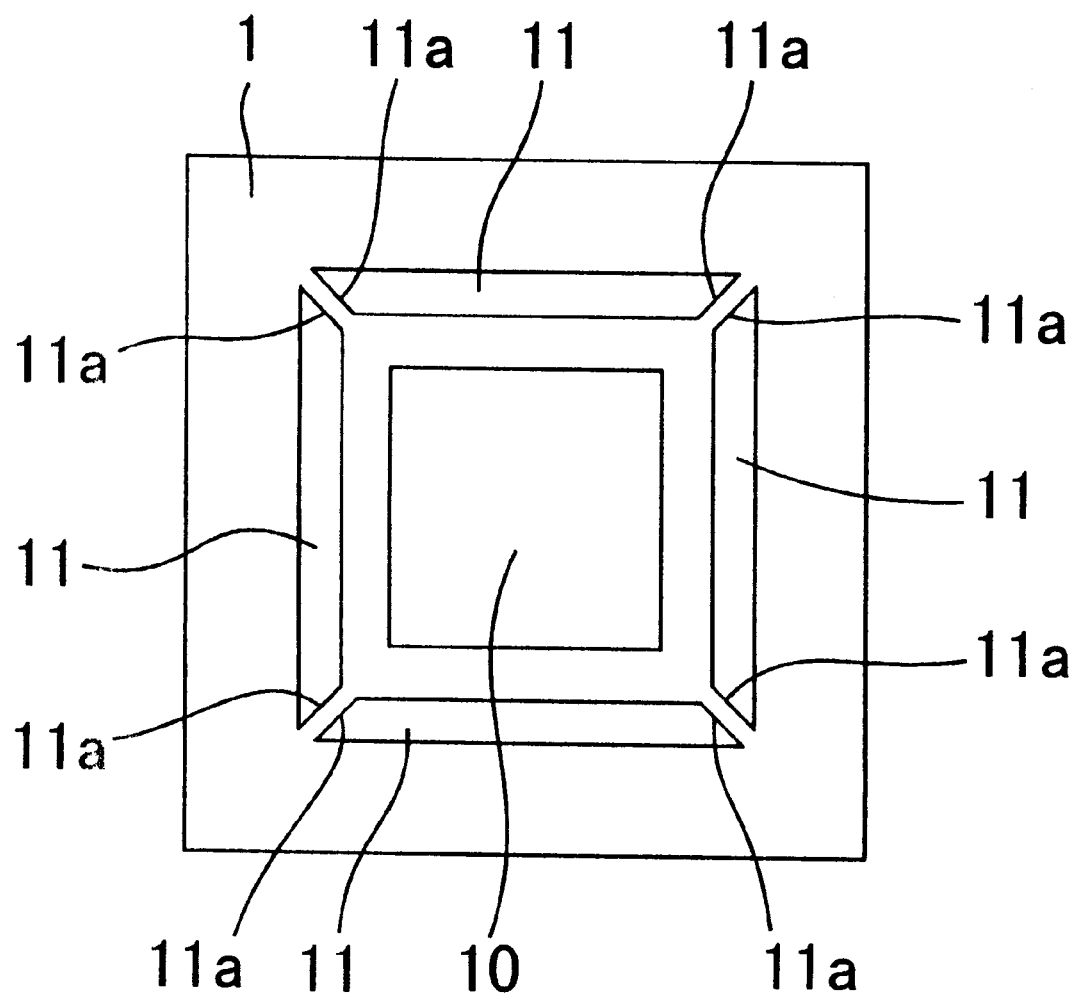
FIG. 2 is a plan view of a reinforcement plate of FIG. 1.

FIG. 1 is a section of the first embodiment of a Tape-BGA type semiconductor device according to the present invention, and FIG. 2 is a plan view of a reinforcement plate of FIG. 1.

As shown in FIG. 1, the shown embodiment of a semiconductor device is formed with leads (not shown) formed on a heat resistant insulative resin film 2 as a TAB tape. The tip ends of the leads are electrically connected to electrodes of a semiconductor chip 3. A metallic reinforcement plate 1 formed with an opening portion 1a which accommodates the semiconductor chip 3 is fixed on the surface of the heat resistant insulative resin film 2. On the other hand, a plurality of solder balls (ball-shaped bumps) 6 are arranged in grid array fashion on externally connecting portions of the leads to form a Tape-BGA structure. In the reinforcement plate 1, slits 11 are provided along the periphery of an opening portion 10 for absorbing a stress.

Such Tape-BGA structure is formed by electrically connecting the leads on the heat resistant insulative resin film with the electrodes on the semiconductor chip 3, protecting the semiconductor chip 3 by sealing the semiconductor chip 3 with a sealing resin 4, subsequently fixing the reinforcement plate 1 on the surface of the heat resistant insulative resin film 2 via a bonding layer 5, and mounting solder balls 6 on the externally connecting portion of the heat resistant insulative resin film 2.

In such Tape-BGA type semiconductor device, in order to absorb a stress created due to difference of a thermal expansion coefficient of the reinforcement plate 1 and a thermal expansion coefficient of a mounting substrate, four slits 11 are formed on the periphery of the opening portion 10 accommodating the semiconductor chip 3 to extend in parallel to respective of four peripheral edges of the opening portion 10. Each slit 11 is an elongated trapezoidal shape, so that mutually opposing taper edges 11a of adjacent slits 11 are opposed with a given interval. By these slits, the stress due to difference of a thermal expansion coefficient of the reinforcement plate 1 and a thermal expansion coefficient of a mounting substrate (not shown) can be successfully absorbed.

Figure 3:
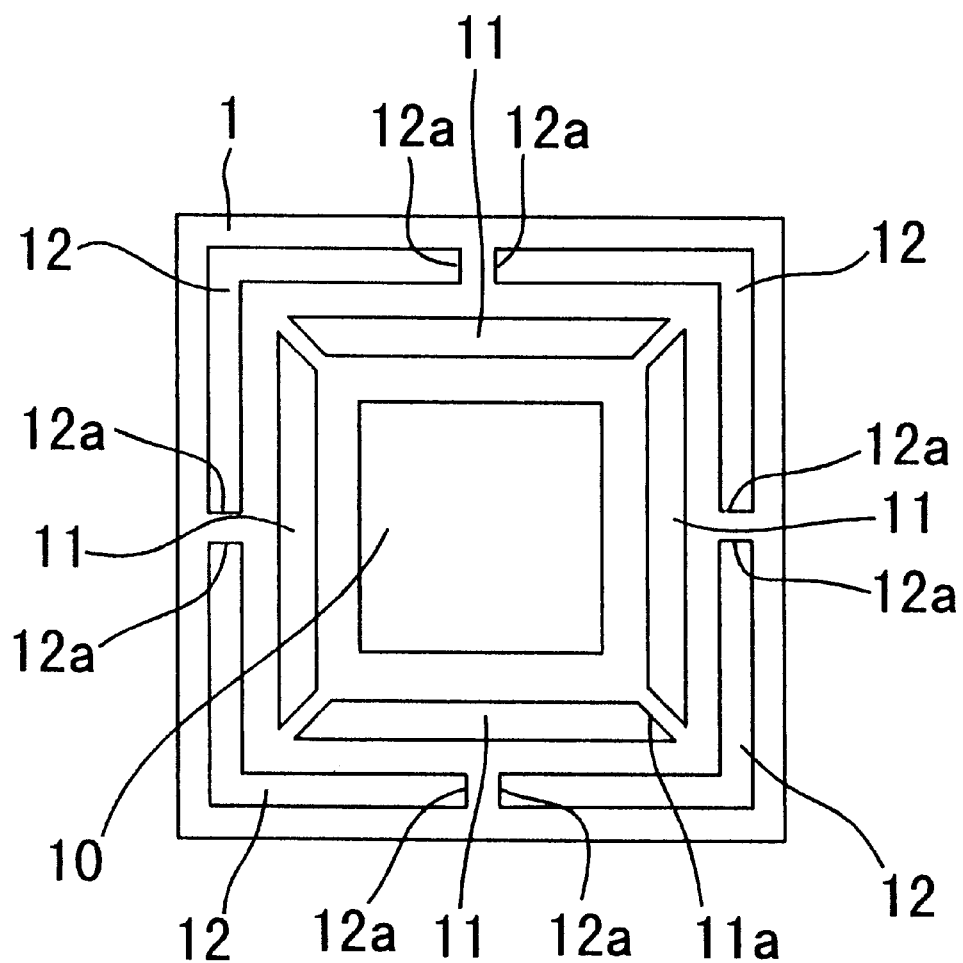
FIG. 3 is a plan view of the reinforcement plate to be used in the second embodiment of the Tape-BGA type semiconductor device of the invention.
Figure 4:
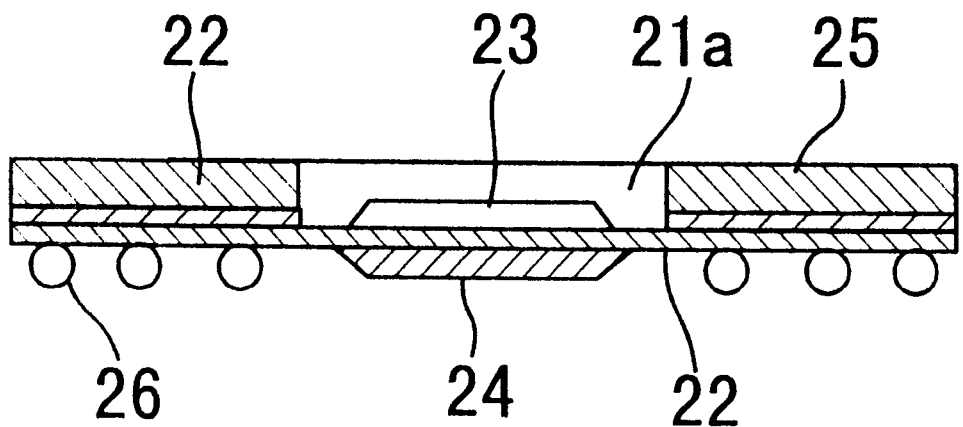
FIG. 4 is a section of the conventional Tape-BGA type semiconductor device.
Figure 5:
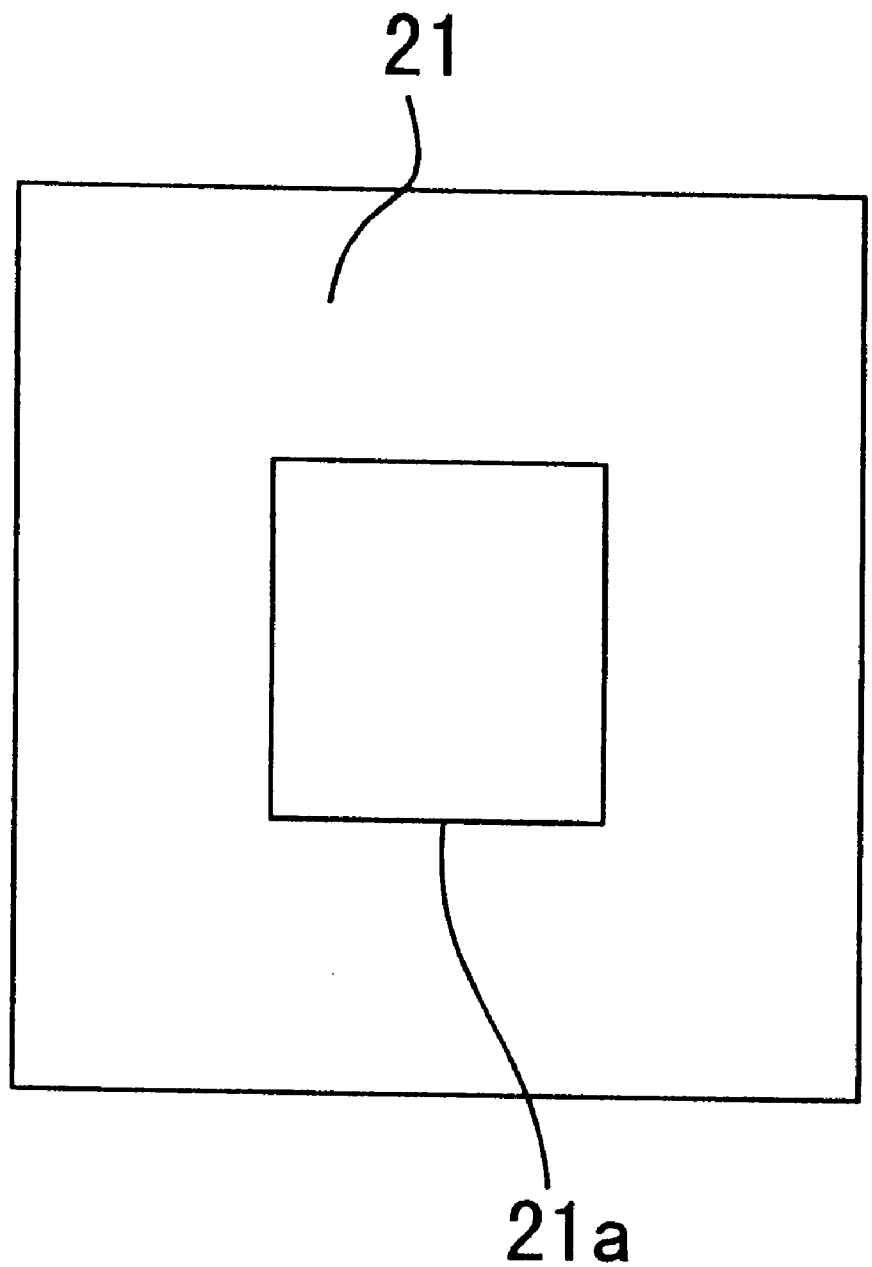
FIG. 5 is a plan view of the reinforcement plate of the semiconductor device of FIG. 4.

When the size of the Tape-BGA type semiconductor device is increased according to increasing of pins, the reinforcement plate 1 becomes greater correspondingly to increase the stress. In such case, four L-shaped slits 12 may be formed on the outer side of the four slits 11 shown in FIG. 2, in the reinforcement plate 1, as illustrated in FIG. 3, in order to further improve an effect for absorbing the stress.

Four L-shaped slits 2 are bent at respective of four corner portions of a quadrangular reinforcement plate 1. The end edges 12a of adjacent slits 12 are opposed in parallel relation ship with a given interval.

As set forth above, according to the present invention, by providing the slits in the reinforcement plate along the opening portion for mounting the semiconductor chip in the Tape-BGA type semiconductor device, stress upon mounting on the substrate can be absorbed. Especially, according to the present invention, since the slits are formed along the peripheral edges in substantially parallel relationship therewith, stress to be exerted on the semiconductor chip due to difference of thermal expansion and contraction coefficients between the semiconductor chip and the reinforcement plate can be effectively absorbed. In addition, in preparation of the reinforcement plate, slits can be easily formed by press process and fixing of the reinforcement plate to the TAB tape can be performed in the similar manner as that in the prior art to provide superior production ability.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A tape-ball grid array type semiconductor device comprising:

leads formed on an insulative resin film, and electrically connected to electrodes of a semiconductor chip at tip ends thereof;

a reinforcement plate having a top surface and a bottom surface formed with an opening portion receiving said semiconductor chip and the entire area of said bottom surface is fixed on the surface of said insulative resin film;

a plurality of ball-shaped bumps are arranged on externally connecting portions of said leads in a grid-array fashion; and said reinforcement plate being provided with slits along and separate from said opening portion for distributing stress.

2. A tape-ball grid array type semiconductor device as set forth in claim 1, wherein said opening portion receiving said semiconductor chip is a quadrangular shape, and said stress distributing slits are provided in parallel to side edges of said opening portion.

3. A tape-ball grid array type semiconductor device as set forth in claim 2, wherein end edges of adjacent stress distributing slits are mutually parallel.

4. A tape-ball grid array type semiconductor device as set forth in claim 1, wherein said stress distributing slits are formed in greater than or equal to two rows along said opening portion receiving said semiconductor chip.

5. A tape-ball grid array type semiconductor device as set forth in claim 1, wherein said insulative resin film is a polyimide film.

6. A tape-ball grid array type semiconductor device as set forth in claim 1, wherein said reinforcement plate is formed of a metal.

* * * * *